United States Patent [19]

Bamler et al.

[11] Patent Number: 5,774,089
[45] Date of Patent: Jun. 30, 1998

[54] METHOD TO RESOLVE AMBIGUITIES IN A PHASE MEASUREMENT

[75] Inventors: Richard Bamler, Gilching, Germany; Gordon Davidson, Vancouver, Canada

[73] Assignee: Deutsche Forschungsanstalt fur Luft-und Raumfahrt e.V., Köln, Germany

[21] Appl. No.: 816,639

[22] Filed: Mar. 13, 1997

[30] Foreign Application Priority Data

Mar. 15, 1996 [DE] Germany .................. 196 10 096.8
Feb. 3, 1997 [DE] Germany .................. 197 063 922.7

[51] Int. Cl.$^6$ .................................................. G01S 13/90
[52] U.S. Cl. .................. 342/25; 342/156; 342/162; 342/191; 342/195; 342/203
[58] Field of Search .................. 342/25, 21, 89, 342/156, 162, 191, 192, 193, 194, 195, 196, 203

[56] References Cited

U.S. PATENT DOCUMENTS

| | | | |
|---|---|---|---|
| 4,843,597 | 6/1989 | Gjessing et al. | 367/15 |
| 4,975,704 | 12/1990 | Gabriel et al. | 342/25 |
| 5,332,999 | 7/1994 | Prati et al. | 342/25 |
| 5,424,743 | 6/1995 | Ghiglia et al. | 342/25 |
| 5,463,397 | 10/1995 | Frankot | 34/25 |
| 5,488,374 | 1/1996 | Frankot et al. | 342/25 |
| 5,552,787 | 9/1996 | Schuler et al. | 342/25 |
| 5,659,318 | 8/1997 | Madsen et al. | 342/25 |
| 5,677,693 | 10/1997 | Frankot et al. | 342/25 |
| 5,706,012 | 1/1998 | Kay | 342/156 |

OTHER PUBLICATIONS

Goldstein et al., "Satellite Radar Interferometry: Two-Dimensional Phase Unwrapping", Radio Science, vol. 23, No. 4, pp. 713–720, Jul.–Aug. 1988.

Hunt, "Matrix Formulation of the Reconstruction of Phase Values from Phase Differences", Journal of the Optical Society of America, vol. 69, No. 3, pp. 393–399, Mar. 1979.

Takajo et al., "Least–Squares Phase Estimation from the Difference", Journal of the Optical Society of America, vol. 5, No. 3, pp. 416–425, Mar. 1988.

Ghiglia et al., "Direct Phase Estimation from Phase Difference Using Fast Elliptic Partial Differential Equatin Solvers", Optics Letters, vol. 14, No. 20, pp. 1107–1109, Oct. 15, 1989.

Ghiglia et al., "Robust Two–Dimensional Weighted and Unweighted Phase Unwrapping that Uses Fast Transforms and Iterative Methods", Journal of the Optical Society of America, vol. 11, No. 1, pp. 107–117, Jan. 1994.

Pritt et al., "Least–Squares Two Dimensional Phase Unwrapping Using FFT's", IEEE Transactions on Geoscience and Remote Sensing, vol. 32, No. 3, pp. 706–708, May 1994.

(List continued on next page.)

Primary Examiner—John B. Sotomayor
Attorney, Agent, or Firm—Browdy and Neimark

[57] ABSTRACT

In a method to resolve ambiguities in a phase measurement for application in radar interferometry, a frequency estimation method is used, starting from conjugate complex products of pairs of adjacent pixels in an interferogram. The resolution of these products is subsequently reduced through successive addition or averaging, after which the differential phase of adjacent resolution levels is determined in each resolution level. The sum of the phase differences yields the estimated value for the phase gradient which is then used in a known method, such as the least-squares method, to reconstruct the absolute phase, thus resolving the phase ambiguities. The method according to the invention serves to resolve phase ambiguities in radar interferograms without producing the known distortions produced by the existing methods. The method is also robust at low coherence values as they occur in repeat-pass interferometry where the existing methods fail. The method allows for a simple adaptation to the common local variations in interferogram quality.

8 Claims, 3 Drawing Sheets

OTHER PUBLICATIONS

Buckland et al., "Unwrapping Noisy Phase Maps by Use of a Minimum–Cost–Matching Algorithm", Applied Optics, vol. 34, No. 23, pp. 5100–5108, Aug. 10, 1995.

Quiroga et al., "Stable–Marriages Algorithm for Preprocessing Phase Maps With Discontinuity Sources", Applied Optics, vol. 34, No. 23, pp. 5029–5038, Aug. 10, 1995.

Fornaro et al., "Two Dimensional Phase Unwrapping Based on the Laplace and Eikonal Equations", 1995 International Geoscience and Remote Sensing Symposium, vol. III, pp 1828–1830, 1995.

Prati et al., "SAR Interferometry: A 2–D Phase Unwrapping Technique Based on Phase and Absolute Value Information", Proc. of Intern. Geoscience and Remote Sensing Symposium, pp. 2043–2046, 1990.

METHOD TO RESOLVE AMBIGUITIES IN A PHASE MEASUREMENT

FIELD OF THE INVENTION

The invention pertains to a method to resolve ambiguities in a phase measurement for application in radar interferometry.

REVIEW OF THE RELATED TECHNOLOGY

The problem of ambiguous phases exists in many technical fields, for example in nuclear magnetic resonance imaging, in holographic and interferometric measurement techniques, such as the so-called speckle interferometry, and also in radar interferometry. The latter is used, for example, to measure the topography of a part of the earth's surface by using phase differences in radar or synthetic aperture radar images obtained from different orientation angles to generate so-called digital elevation models (DEM). The technical problem to be solved is described below, based on the example of the radar interferometry.

Radar interferometry uses the measurement of local time delay differences $\Delta\tau(i, k)$ between two complex-valued radar images, $u_1(i, k)$ and $u_2(i, k)$, for purposes such as topography construction. The indices i and k denote the location of a pixel in the two-dimensional image matrix.

The two radar images are either taken with two antennas in the course of a single pass (the so-called single-pass interferometry) or with one antenna in the course of two passes (the so-called repeat-pass interferometry).

To measure the time delay differences $\Delta\tau(i, k)$, a conjugate complex multiplication of the radar images is performed, the result of which is called interferogram, $$z(i,k) = u_1(i,k) \cdot u_2^*(i,k)$$

where the asterisk means "complex conjugate"

The phase of the interferogram is the difference between the phases of the individual images and has the following relationship to the required time delay difference $\Delta\tau(i,k)$ (without considering noise and measurement errors):

$$\phi = 2\pi f \cdot \Delta\tau \quad (1)$$

where $f$ is the carrier frequency of the radar signal. The time delay difference $\Delta\tau$ is generally significantly greater than $1/f$. The phase of the interferogram, however, can only be determined to an ambiguity of an integer multiple of $2\pi$. With $\psi = \arg\{z\}$ and $-\pi < \psi \leq \pi$, the following is therefore true:

$$\phi = \psi + n \cdot 2\pi \quad (2)$$

where n is an integer.

The measured phase $\psi$ is thus the principal value of the required phase $\phi$ restricted to the baseband $(-\pi \ldots +\pi)$. This "wrapping" into the baseband is expressed by the operator W:

$$\psi(i,k) = W\{\phi(i,k)\} \quad (3)$$

The relationship between the absolute phase $\phi$ and the wrapped phase $\psi$ is illustrated in FIG. 1, based on a one-dimensional example. Discontinuities are visible in the shape of $\psi$ in locations where $\phi$ leaves the boundaries of the baseband or integer multiples of the baseband, respectively. The technical problem to be solved consists of resolving the above ambiguities, i.e. performing the reconstruction of $\phi(i, k)$ from $\psi(i, k)$. This process is commonly referred to as "phase unwrapping".

From the one-dimensional example in FIG. 1, it can be seen that the discontinuities in the shape of $\psi$ can be used to determine whether $\phi$ is leaving the baseband, and to reconstruct the absolute phase through addition of $2\pi$, as appropriate. Mathematically, this type of reconstruction may be described as the summation of the wrapped phase differences of $\psi$:

$$\hat\phi(i) = \sum_{i'=0}^{i} W\{\psi(i'+1) - \psi(i')\} \quad (4)$$

where $\hat\phi$ denotes the reconstruction (and also the estimated value) of $\phi$.

This method is only possible if the discontinuities can be conclusively identified, e.g. as excessively high values in the discrete derivative of $\psi$. However, if the shape of $\phi$ already shows strong fluctuations, some of these rapid changes might be misinterpreted as the above discontinuities, or actual discontinuities might not be recognized. The result is a flawed reconstruction of $\phi$ that differs from the actual shape by locally varying integer multiples of $2\pi$.

In the two-dimensional case that is of interest here, a direct approach according to equation (4) is not possible because the result $\hat\phi$ usually—i.e, when noise is taken into consideration—depends on the summation path. Mathematically, this means that the estimated gradient field $$\hat\nabla\psi(i,k) = \begin{pmatrix} W\{\psi(i+1,k) - \psi(i,k)\} \\ W\{\psi(i,k+1) - \psi(i,k)\} \end{pmatrix} \quad (5)$$

is not conservative, i.e, it does not have a potential field. This means that $\hat\nabla \psi(i,k)$ contains a non-vanishing solenoidal fraction.

The dominant phase noise terms in radar interferograms are due to thermal receiver noise or a so-called decorrelation of the imaged object. One measure for these disturbances is the so-called coherence of the two individual images. The coherence is normalized to values between 0 (no information, only noise) and 1 (no noise).

With the repeat-pass interferometry, in particular, the coherence greatly depends on the type of object. Water surfaces, for instance, have a coherence of 0, forests have a coherence in the range of 0.2 to 0.6, and dry rock has a coherence of up to 0.9. A radar interferogram generally consists of areas with greatly varying coherences, thus requiring a robust phase reconstruction method.

The prior art with respect to the two-dimensional phase reconstruction is presented in the following publications:

[1] R. M. Goldstein, H. A. Zebker, and C. L. Werner, "Satellite radar interferometry: two-dimensional phase unwrapping," Radio Science, Vol. 23, pages 713 through 720, 1988.

[2] J. R. Buckland, I. M. Huntley, and S. R. E. Turner, "Unwrapping noisy phase maps by use of a minimum-cost-matching algorithm," Applied Optics, vol. 34, pages 5100 through 5108, 1995.

[3] J. A. Quiroga, A. González-Cano, and E. Bernabeu, "Stable-marriages algorithm for prepocessing phase maps with discontinuity sources, Applied Optics, vol. 34, pages 5029 through 5038, 1995.

[4] C. Prati, M. Giani, and N. Leurati, "SAR interferometry: A 2-D phase unwrapping technique based on phase and absolute values informations" in: Proc. Int. Geoscience & Remote Sensing Symposium IGARSS 1990, Washington, D.C., pages 2043 through 2046, 1990.

[5] B. R. Hunt, "Matrix formulation of the reconstruction of phase values from phase differences", Journal of the Optical Society of America, Vol. 69, pages 393 through 399, 1979.

[6] H. Takajo and T. Takahashi, "Least-squares phase estimation from the phase difference," Journal of the Optical Society of America A, vol. 5, pages 416 through 425, 1988.

[7] D. C. Ghiglia and L. A. Romero, "Direct phase estimation from phase differences using fast elliptic partial differential equation solvers," Optics Letters, vol. 14, pages 1107 through 1109, 1989.

[8] D. C. Ghiglia and L. A. Romero, "Robust two-dimensional weighted and unweighted phase unwrapping that uses fast transforms and iterative methods," Journal of the Optical Society of America, A. vol. 11, pages 107 through 117, 1994.

[9] M.D. Pritt, J.S. Shipman, "Least-squares two dimensional phase unwrapping using FFT's," IEEE Transactions on Geoscience and Remote Sensing, vol. 32, pages 706 through 708, 1994.

All known methods essentially use the gradient $\hat{\nabla}\psi(i,k)$, which is calculated from wrapped phase differences between adjacent phase values, as described in equation (5). These methods can be divided into two categories:

The category of the so-called branch-cut-methods ([1] through [4]) uses a device to recognize so-called phase inconsistencies or residues. These are points in the interferogram that are defined by the fact that a closed summation path drawn around them does not yield the value 0 but rather $+2\pi$ or $-2\pi$. These are accordingly called positive or negative residues. Mathematically, these points correspond to points for which the following is true:

$$\nabla \times \hat{\nabla}\psi = \pm 2\pi \neq 0 \qquad (6)$$

With the branch-cut method, lines are drawn to connect the positive and negative residues, respectively. The phase reconstruction is finally performed with the summation of $\hat{\nabla}\psi(i,k)$, with the restriction regarding the summation path, that none of the connecting lines may be crossed.

The category of the so-called least-squares-methods ([5] through [9]) uses suitable methods to search for a phase function $\hat{\phi}$, the gradient of which comes closest to the estimated gradient $\hat{\nabla}\psi$ from equation (5).

$$\sum_i \sum_k |\nabla\hat{\phi}(i,k) - \hat{\nabla}\psi(i,k)|^2 \to \min. \qquad (7)$$

A variation of this method, the so-called weighted least-squares method, additionally uses weightings of the individual gradients for a more accurate inclusion of local variations in coherence.

The prior art has the following disadvantages: With the branch-cut methods, the reconstruction result greatly depends on how the connecting lines are drawn. Especially in the case of a low coherence (for example 0.2), this method fails completely since the residue density is so high in this case, that no summation path can be found.

For example, with these methods, a summation cannot be performed across a river. Frequently it is also not possible to connect all positive or all negative residues; reconstruction deficiencies remain in the form of phase leaps of $2\pi$ that may span large areas of the interferogram and will usually render the interferogram useless for topographical reconstruction.

To avoid these disadvantages, the complex interferogram values are frequently averaged locally, prior to the actual branch-cut reconstruction. While this does reduce the number of residues, as desired, it also suppresses potentially useful high-frequency phase information, especially in mountainous terrain. Even with this pre-processing, however, the branch-cut methods are not able to bridge regions with a coherence of 0.

The least-squares methods are based on an incorrect, i.e, an additive model for noise. The interference that really needs to be taken into consideration is the solenoidal component in the estimated gradient $\hat{\nabla}\psi$, i.e., phase differences wrongly wrapped into the baseband. This portion, however, greatly depends on the (noise-free) shape of the absolute phase $\phi$.

Based on the above, it can be shown that all methods using a linear application of the estimated gradient $\hat{\nabla}\psi$ calculated according to equation (5), result in strong distortions of the reconstructed phase. In addition to the least-squares methods used until now, this also holds true for another, similar method, which is described in: [10] G. Fornaro, G. Franceschetti, R. Lanari, "Two dimensional phase unwrapping based on the Laplace and eikonal equations" in: Proc. Int. Geoscience & Remote Sensins Symposium IGARSS '95, Florence, Italy, pages 1828 through 1830, 1995.

The degree of the distortion increases as the coherence decreases. Low-coherent areas furthermore also distort surrounding, possibly highly coherent areas. Even the weighting proposed in [8] can only prevent this error in certain instances.

SUMMARY OF THE INVENTION

Accordingly, the present invention has an object, among others, to overcome deficiencies in the prior art such as noted above.

The aim of the invention is therefore to create a method to resolve ambiguities in a phase measurement for application in radar interferometry, in which the above disadvantages of the known methods are avoided by not using the phase differences wrapped in the baseband as the starting point, as described in equation (5).

According to the invention, the gradient $\nabla\psi$ is determined from the complex interferogram values with the help of a special method for local frequency estimation, as opposed to the known methods in which the phase differences wrapped into the baseband are used as the starting point, as described in equation 5. The absolute phase $\phi$ is reconstructed by one of the known (optionally weighted) least-squares methods, or the method described in [10, ]from the gradients calculated according to the invention.

In the following, $z(i,k)$ denotes the interferogram and $\psi(i,k)=\arg\{z(i,k)\}$ denotes its (wrapped) phase. The wrapped phase differences in equation (5) can also be expressed as follows, for example for the component i:

$$W\{\psi(i+1,k)-\psi(i,k)\}=\arg\{z(i+1,k)\cdot z^*(i,k)\} \qquad (8)$$

The accuracy of this estimated gradient value could be improved by averaging several adjacent values. Because of the non-linear operation $W\{\cdot\}$, however, this averaging process does not completely eliminate the wrongly wrapped values. The method according to the invention therefore uses an averaging of the complex values $z(i+1)\cdot z^*(i)$ that are not subject to any wrapping.

For this purpose, the following two products are calculated from the interferogram, for example with the help of a shift register and a multiplier 2 (in FIG. 2):

$$C^i_0(i,k)=z(i+1,k)\cdot z^*(i,k) \qquad (9)$$

and $$C^k_0(i,k)=z(i,k+1)\cdot z^*(i,k) \qquad (10)$$

In these products, a linear phase ramp with a uniform gradient in $z(i,k)$ for example, appears as a constant phase that is not affected by the averaging process.

Starting with the $C_0$-values, N products with a lower resolution are produced through continuous averaging (or addition) of adjacent values: $C_1 \ldots C_2 \ldots C_N$. In signal processing, in a different context, the representation of a signal based on a sequence of successively reduced resolutions is referred to as multi-resolution-image or resolution pyramid. The latter term is based on the fact that, as the resolution decreases, the number of pixels can also be reduced.

The phase of the function $C_N$, i.e, $$\delta^{1k}{}_N(i,k) = \arg\{C^{1k}{}_N(i,k)\} \tag{11}$$

is an estimated value for the components of the mean phase gradient across a very large area, e.g. across the entire interferogram. (The superscript expression "i,k" means that the same formula applies to both, i and k)

The gradient determined in this manner is highly exact but not yet of a sufficiently high resolution. In the next-higher resolution levels, only the correction value is determined for the value from the previous resolution level:

$$\gamma^{i,k}{}_{N-1}(i,k) = \arg\{C^{i,k}{}_{N-1}(i,k) \cdot C^{i,k^*}{}_N(i,k)\} \tag{12}$$

or, in general:

$$\gamma^{i,k}{}_n(i,k) = \arg\{C^{i,k}{}_n(i,k) \cdot C^{i,k^*}{}_{n+1}(i,k)\} \tag{13}$$

This method is continued until a desired resolution "$n_{min}$" has been reached, e.g. to $C_0$. The final estimated gradient value, as it is used in the least-squares reconstruction, for example, ultimately results as follows:

$$\hat{\nabla}\psi(i,k) = \sum_{n=n_{min}}^{N} \begin{pmatrix} \delta_n^i(i,k) \\ \delta_n^k(i,k) \end{pmatrix} \tag{14}$$

BRIEF DESCRIPTION OF THE DRAWING FIGURES

The above and other objects and the nature and advantages of the present invention will become more apparent from the following detailed description of an two preferred embodiments taken in conjunction with drawings, wherein.

DETAILED DESCRIPTION OF THE PREFERRED EMBODIMENT

Following is a description of two preferred versions of the method according to the invention. These versions may be implemented in the form of either hardware or software solutions. Because of their robustness and simplicity, and the fact that no manual adjustments are made, both versions are also particularly suitable for systems with real time requirements, customarily implemented in hardware.

Figure 1:
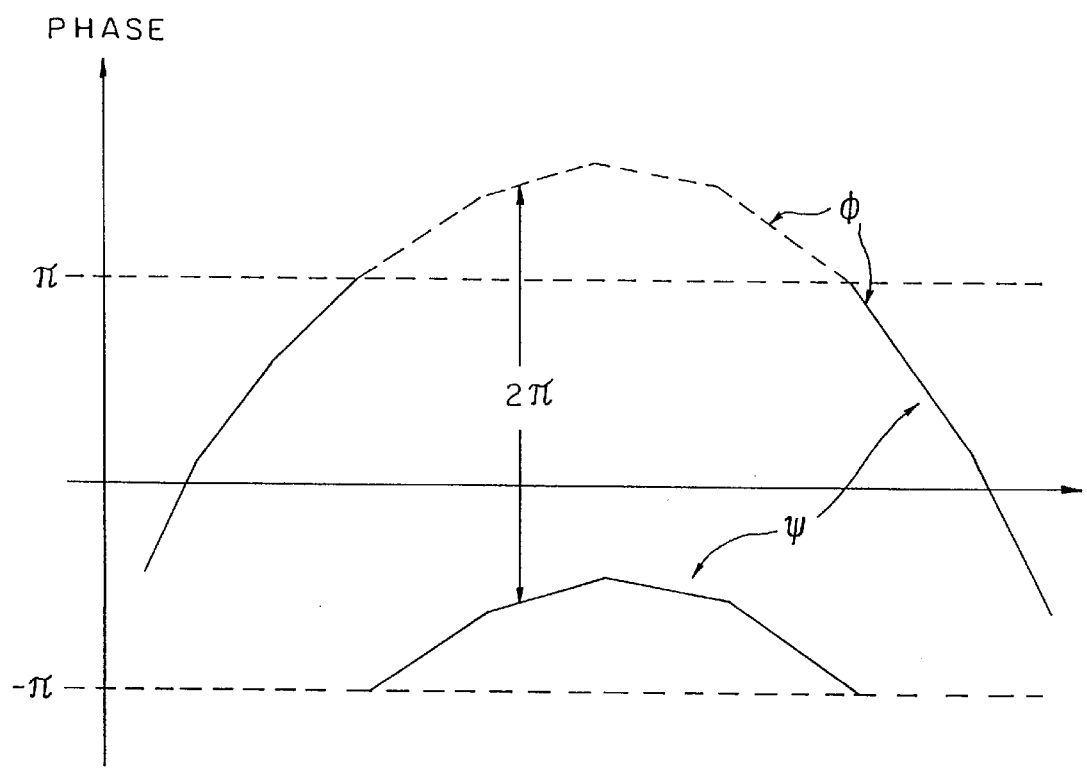
FIG. 1 is a graphical view showing the relationship between the absolute phase $\phi$ and the measured phase $\psi$ in the baseband $-\pi \ldots +\pi$.
Figure 2:
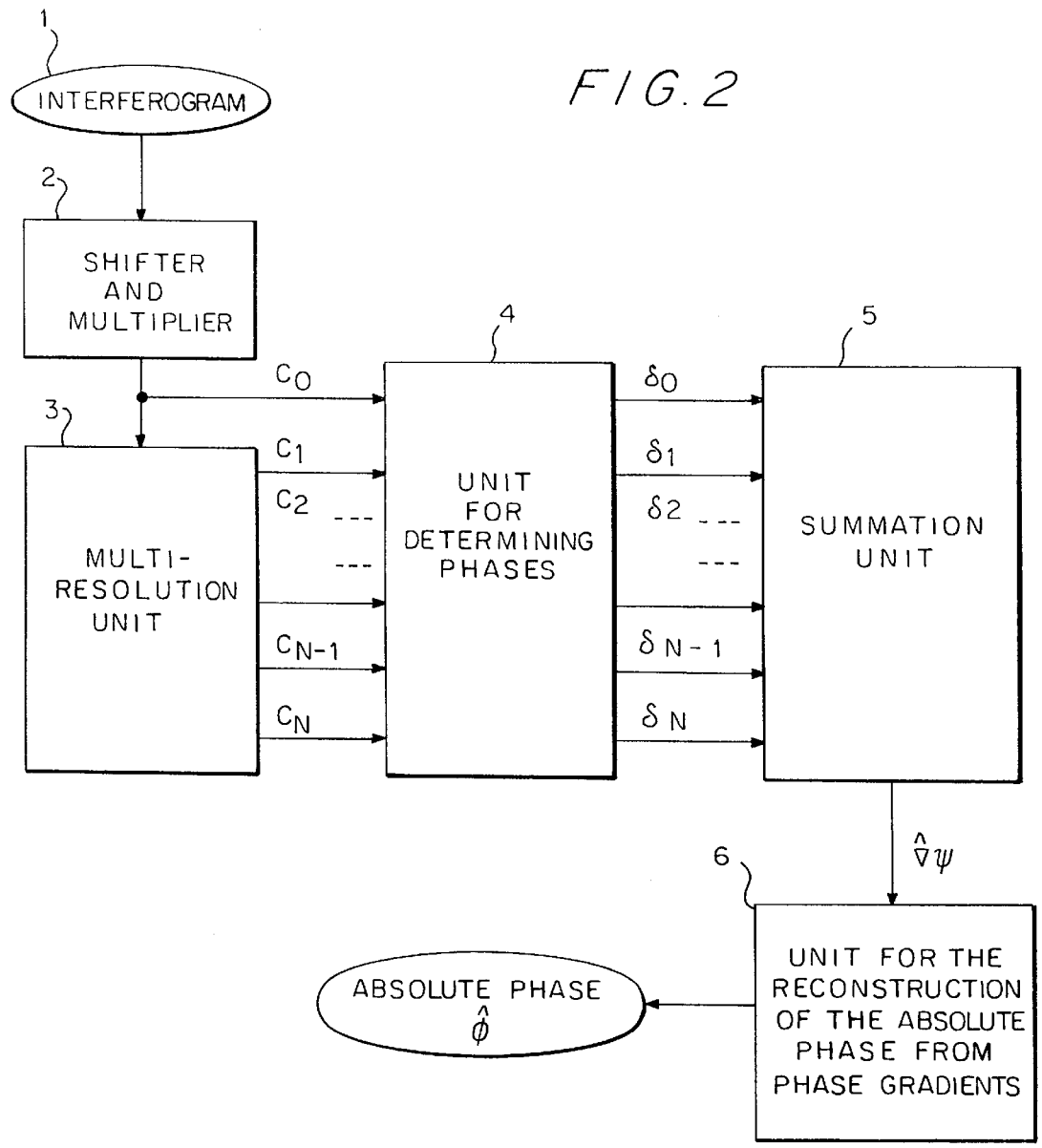
FIG. 2 is a schematic view showing a flow chart for the method according to the invention.

In the version of the method according to the invention shown in FIG. 2, two products are formed from an interferogram 1 and a subsequent shifter and multiplier 2 according to the equations (9) and (10). The resulting products are reduced in increments in their resolution in a multi-resolution unit 3, through averaging or addition of adjacent pixel values, as appropriate. In a phase-determination unit 4 following the multi-resolution unit 3, differential phases $\delta_0$ to $\delta_N$ are formed from the products $C_0$ through $C_N$ according to the equations (11) through (13). The differential phases $\delta_0$ to $\delta_N$ are added up from the lowest resolution level to a predetermined resolution level in a summation unit 5, to produce an estimated value of the gradient field $\hat{\nabla}\psi$, according to equation (14).

The gradient field $\hat{\nabla}\psi$ is used in a subsequent unit 6 for the reconstruction of the absolute phase from the estimated gradient values, to reconstruct the absolute phase $\hat{\phi}$. The original ambiguities have thus been resolved.

In both versions, the products $C_0^i(i,k)$ and $C_0^k(i,k)$ according to the equations (9) and (10), are used as the starting point, and a least-squares reconstruction as the last step (see FIG. 2). The two versions differ in how the averaging process is performed. The first version, referred to below as "redundance-free", is described in detail below, whereas for the second version, only the differences between the two versions are described.

In the redundance-free version, the values of a resolution level "n" are calculated by adding four adjacent values (2 each, in i and k) from the preceding level "n-1":

$$C_n^{i,k}(i_n,k_n) = \sum_{m=0}^{l} \sum_{j=0}^{l} C_{n-1}^{i,k}(2i_n+j, 2k_n+m) \tag{15}$$

(The subscript n in the pixel indices i and k denotes that, in this representation, each resolution level has its own pixel grid.)

Figure 3:
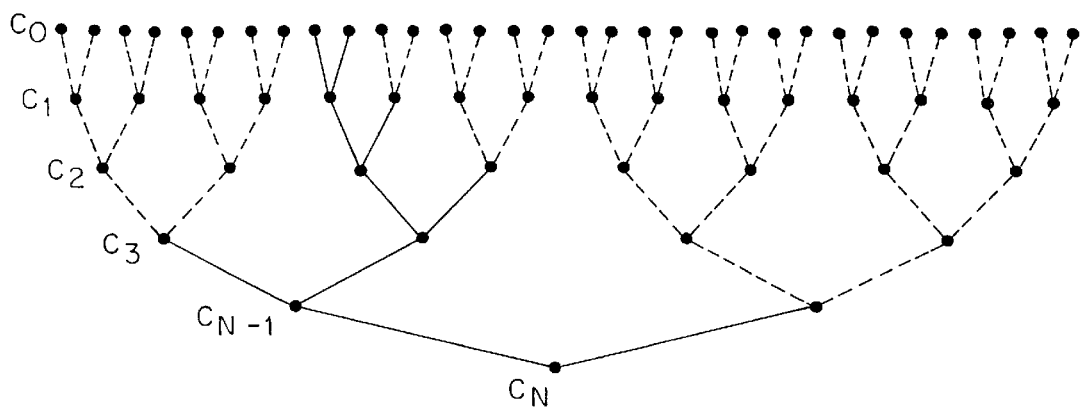
FIG. 3 is a graphical view showing, for the one-dimensional case, a schematic representation of a redundance-free version of the averaging method.

The number of pixel values is therefore reduced in each resolution level by the factor of 2 in i and k, as compared to the preceding level. FIG. 3 shows the redundance-free averaging method according to the invention for the one-dimensional case. Where two points are connected to one point of the next resolution level, this means that the values of these two points added together yield the new point. An example addition process is indicated in each resolution level in the form of a thick line.

If, as shown in FIG. 2, the interferogram 1 consists of $(2^N+1)^2$ pixel values, for example, the two $C_0^{i,k}$ each have $(2^N)^2$ pixel values that are reduced by the factor $2^2$ from resolution level to resolution level, until the phases $\delta_N^{i,k}$ of the $C_N^{i,k}$ represent the mean gradient of the entire interferogram according to equation (11). $\delta_N^{i,k}$ is thus used as the addend in equation (14) for all pixel values of $\hat{\nabla}\psi(i,k)$. The phases of the $C_{N-1}^{i,k}$ each represent the mean gradient of a quarter of the interferogram 1, those of the $C_{N-2}^{i,k}$ represent the gradient of one sixteenth, and so forth.

The reduction of the pixel rate from resolution level to resolution level in this redundance-free version produces a minimum amount of intermediate terms to be stored, which is advantageous for a real-time implementation. Instead of averaging over $2^2$ pixel values, respectively, it is also possible to average over a greater number of pixel values.

The reduction of the pixel rate in the redundance-free version can also be a disadvantage if not all of the phases $\delta_N^{i,k}$ are to be used to the highest resolution level "0" for the determination of the gradient, but only to the level "$n_{min}$". This may be necessary if the reconstructed phase and thus the DEM is required in a low resolution, which is especially meaningful in areas with a low coherence. In this case, the estimated gradient values are located on a pixel matrix with a larger spacing than that of the interferogram, which may necessitate an interpolation of the phase values. This disadvantage is avoided in the second preferred version, which is why it is referred to below as "redundant".

In the redundant version, the original pixel grid of the interferogram—and accordingly also that of $C_0^{i,k}$— is maintained in each resolution level. For reasons of symmetry, the averaging process is preferably performed over an odd number of pixel values, in the following example over $3^2$:

$$C_n^{i,k}(i,k) = \sum_{m=-1}^{1} \sum_{j=-1}^{1} C_{n-1}^{i,k}(i+j \cdot 3^{(n-1)}, k+m \cdot 3^{(n-1)}) \quad (16)$$

Figure 4:
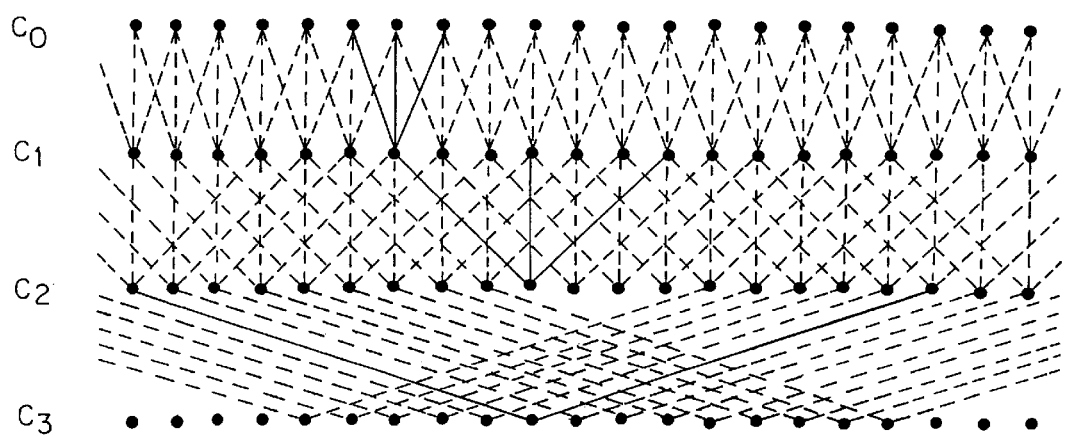
FIG. 4 is a graphical view showing, also for the one-dimensional case, the averaging diagram of the redundant method for the first three resolution levels.

In FIG. 4 the redundant averaging diagram is presented for a one-dimensional case.

In the redundant method, the determination of the estimated gradient value may be aborted at any arbitrary resolution level "$n_{min}$". This resolution level may be different for each pixel value and based, for example, on the local coherence. In this manner, areas with a high coherence are reconstructed with a high resolution, and areas with a low coherence are reconstructed with a low resolution.

Since the application of the redundant method requires intermediate storage of a considerably greater number of averaging results $C^{i,k}$ than the redundance-free method, a mixed method is described below:

The above-described redundant method is used, starting from the highest resolution $C_0^{i,k}$ until a predetermined resolution level is reached. The redundant process is used for the subsequent lowering of the resolution level. With radar interferograms, it has proven advantageous to use the redundant method in the version according to the equation (16), proposed here as an example, for the calculation from $C_1^{i,k}$ to $C_3^{i,k}$ or $C_4^{i,k}$.

The method for obtaining an estimated gradient value, described by the equations (9) through (14), is based on the products $C_0^{i,k}(i,k)$ that are formed from the immediately adjacent interferogram values $z(i+1,k)$ and $z(i,k)$, or $z(i,k+1)$ and $z(i,k)$, as described in equations (9) and (10). The accuracy of this method can be improved even further if additional products are used from interferogram pixel values that are spaced farther apart.

A preferred method in which the product of one value is always used together with two adjacent values is described below as an example (this method can easily be expanded to more than two adjacent values). For this purpose, the following four products are calculated in the multiplier 2 (shown in FIG. 2):

$$C_{1,0}{}^i(i,k) = z(i+1,k) \cdot z^*(i,k) \quad (9\text{-}1)$$

$$C_{1,0}{}^k(i,k) = z(i,k+1) \cdot z^*(i,k) \quad (10\text{-}1)$$

and $$C_{2,0}{}^i(i,k) = z(i+2,k) \cdot z^*(i,k) \quad (9\text{-}2)$$

$$C_{2,0}{}^k(i,k) = z(i,k+2) \cdot z^*(i,k) \quad (10\text{-}2)$$

From these products $C_{1,0}^{i,k}$ and $C_{2,0}^{i,k}$ products of a lower (coarser) resolution are formed through continued averaging (or addition):

$$C_{1,1}^{i,k} \ldots C_{1,n}^{i,k} \ldots C_{1,N}^{i,k}$$
$$C_{2,1}^{i,k} \ldots C_{2,n}^{i,k} \ldots C_{2,N}^{i,k}.$$

An estimated gradient value is subsequently calculated in each resolution level 'n' according to the following equation:

$$f_n^{i,k}(i,k) = \arg\{C_{1,n}^{i,k}(i,k)\} + \tfrac{1}{2}\arg\{C_{2,n}^{i,k}(i,k)(C_{1,n}^{i,k*}(i,k))^2\} \quad (17)$$

Starting from these values $f_n^{i,k}$, the contributions of each resolution level to the total estimated gradient value are determined. Starting with the lowest resolution, the following are obtained:

$$\delta_N^{i,k}(i,k) = f_N^{i,k}(i,k) \quad (18)$$

and for all other resolution levels in general:

$$\delta_{90}{}^{i,k}(i,k) = f_n^{i,k}(i,k) + \arg\{C_{1,n}^{i,k}(i,k) \exp\{-j\ f_{n+1}^{i,k}(i,k)\}\} - \arg\{C_{1,n}^{i,k}(i,k)\} \quad (19)$$

The final estimated gradient value is calculated according to equation (14).

Radar interferograms commonly contain considerable local variations in quality, i.e, varying coherences and accordingly also phase noise. Phases noise can be reduced by reducing the resolution. With the above method, the local resolution of the estimated gradient value and accordingly also that of the reconstructed phase, may be selected arbitrary, by selecting $n_{min}$ in equation (14). With the improvement described below, $n_{min}$ can be adapted locally.

For this purpose, the current estimated gradient value according to $$\hat{\nabla}\psi_m(i,k) = \sum_{n=m}^{N} \begin{pmatrix} \delta_n^i(i,k) \\ \delta_n^k(i,k) \end{pmatrix} \quad (20)$$

is first calculated in each resolution level $n=m$ according to equation (14), and its solenoidal component subsequently determined, for example, with a shifter and adder:

$$r_m(i,k) = \hat{\nabla}\psi^i{}_m(i,k) + \hat{\nabla}\psi^k{}_m(i+1,k) - \hat{\nabla}\psi^i{}_m(i,k+1) - \hat{\nabla}\psi^k{}_m(i,k) \quad (21)$$

whereby the superscript indices 'i' and 'k' denote the respective component i or k of the vector $\hat{\nabla}\psi_m$. In the case of error-free values $\hat{\nabla}\psi_m$, $r_m(i,k) = 0$. With increasing phase noise, $\hat{\nabla}\psi_m$ contains an increasing amount of errors, and $r_m(i,k) \neq 0$. For each pixel value $(i,k)$, $n_{min}$ is then determined as the smallest number for which the following is true:

$|r_m(i,k)| \leq S$ for all $N \geq m \geq n_{min}$ where S is a selectable threshold. A value $S = 0.2 \cdot \pi$ has proven effective in a prototype implementation.

With respect to adapting the resolution to a local interferogram quality, the local interferogram data are only processed to the resolution in this method, at which the estimated gradient values are still approximately conservative.

What is claimed is:

1. A method for resolving ambiguities in a phase measurement in radar interferometry, comprising the steps of:
    (a) providing radar data of a two-dimensional image matrix including pixels indexed by i and k;
    (b) forming an interferogram $z(i,k)$ from the radar data;
    (c) providing a shifter and an adder;
    (d) forming from the interferogram in the shifter and the adder a first product $$C_0^i(i,k) = z(i+1,k) \cdot z^*(i,k)$$

and a second product $$C_0^k(i,k) = z(i,k+1) \cdot z^*(i,k),$$

wherein z* denotes a complex conjugate of z;

(e) providing a multi-resolution unit (3);

(f) subsequently reducing resolution of the first product and the second product by N increments in the multi-resolution unit, the step of reducing resolution including at least one of
a step of averaging adjacent pixels and
a step of adding adjacent pixels;

(g) providing a phase determination unit (4);

(h) forming differential phases, between pairs of adjacent resolution levels in the phase determination unit, sequentially according to $$\delta_N^{i,k}(i,k)=\arg\{C_N^{i,k}(i,k)\},$$

$$\delta_{N-1}^{i,k}(i,k)=\arg\{C_{N-1}^{i,k}(i,k) \cdot C_N^{i,k*}(i,k)\},$$

and in general $$\delta_n^{i,k}(i,k)=\arg\{C_n^{i,k}(i,k) \cdot C_{n+1}^{i,k*}(i,k)\},$$

wherein superscript letters i, k indicate that an equation applies to both indices i, k,
$C_n$ is a function produced by an nth step of the resolution reduction, and
$\delta_n^{i,k}$ is a differential phase of the function $C_n$ to $C_{n+1}$, where
n=1, 2, 3 ... N;

(i) providing a summation unit (5);

(j) determining estimated gradient values
$\hat{\nabla}\psi(i,k)$
of a phase gradient field by adding the differential phases in the summation unit from a lowest resolution level N to a predetermined resolution level $n_{min}$;

(k) providing a reconstruction unit (6); and finally (l) reconstructing, in the reconstruction unit, an absolute phase $\hat{\phi}$ from the estimated gradient values of the phase gradient field, whereby the ambiguities are resolved.

2. The method according to claim 1, including a step of reducing a density of the image matrix by factors $M_i$ and $M_k$ in respective coordinates i and k, wherein the number of added adjacent pixels is $M_i$ and $M_k$.

3. The method according to claim 1, including a step of adding an odd number of pixel values from a next-higher resolution level, wherein the density and dimension fo the image matrix are maintained.

4. The method according to claim 1, wherein the step of determining estimated gradient values includes a step of including phases of high resolution level in a determination of the phase gradient in the summation unit (5) and the phases of high resolution level functionally depend on a locally varying quality measure in the interferogram.

5. The method according to claim 5, wherein the locally varying quality measure in the interferogram is coherence.

6. The method according to claim 5, wherein the step of determining estimated gradient values includes a step of determining whether a solenoidal component of the estimated gradient value is below a predetermined threshold.

7. The method according to claim 1, wherein the step of forming from the interferogram in the shifter and the adder includes forming a first product $$C_0^i(i,k)=z(i+p,k) \cdot z^*(i,k)$$

and includes forming a second product $$C_0^k(i,k)=z(i,k+p) \cdot z^*(i,k),$$

where p is a positive integer greater than 1.

8. A method for resolving ambiguities in a phase measurement in radar interferometry, comprising the steps of:

(a) providing radar data of a two-dimensional image matrix including pixels indexed by i and k;

(b) forming an interferogram z(i,k) from the radar data;

(c) forming from the interferogram a first product $$C_0^i(i,k)=z(i+1,k) \cdot z^*(i,k)$$

and a second product $$C_0^k(i,k)=z(i,k+1) \cdot z^*(i,k),$$

wherein z* denotes a complex conjugate of z;

(d) subsequently reducing resolution of the first product and the second product by N increments, the step of reducing resolution including at least one of
a step of averaging adjacent pixels and
a step of adding adjacent pixels;

(e) forming differential phases, between pairs of adjacent resolution levels, sequentially according to $$\delta_N^{i,k}(i,k)=\arg\{C_N^{i,k}(i,k)\},$$

$$\delta_{N-1}^{i,k}(i,k)=\arg\{C_{N-1}^{i,k}(i,k) \cdot C_N^{i,k*}(i,k)\},$$

and in general $$\delta_n^{i,k}(i,k)=\arg\{C_n^{i,k}(i,k) \cdot C_{n+1}^{i,k*}(i,k)\},$$

wherein superscript letters i, k indicate that an equation applies to both indices i, k,
$C_n$ is a function produced by an nth step of the resolution reduction, and
$\delta_n^{i,k}$ is a differential phase of the function $C_n$ to $C_{n+1}$, where
n=1, 2, 3 ... N;

(f) determining estimated gradient values
$\hat{\nabla}\psi(i,k)$
of a phase gradient field by adding the differential phases from a lowest resolution level N to a predetermined resolution level $n_{min}$; and finally (g) reconstructing an absolute phase $\hat{\phi}$ from the estimated gradient values of the phase gradient field, whereby the ambiguities are resolved.

* * * * *